United States Patent [19]
Acuff

[11] Patent Number: 4,586,022
[45] Date of Patent: Apr. 29, 1986

[54] WAVEFORM MEMORY CIRCUIT
[75] Inventor: Mark Acuff, Hillsboro, Oreg.
[73] Assignee: Tektronix, Inc., Beaverton, Oreg.
[21] Appl. No.: 681,398
[22] Filed: Dec. 13, 1984
[51] Int. Cl.⁴ .......................................... H03K 13/02
[52] U.S. Cl. ............................................ 340/347 AD
[58] Field of Search .................. 340/347 AD, 347 SH
[56]         References Cited
         U.S. PATENT DOCUMENTS
   3,753,133  8/1973  Shumate, Jr. ............. 34/347 AD X
   4,291,299  9/1981  Hinz et al. ................... 340/347 AD
   4,318,188  3/1982  Hoffmann ................. 34/347 AD X Primary Examiner—Vit W. Miska
Attorney, Agent, or Firm—John P. Dellett

[57]        ABSTRACT

A waveform memory circuit samples an analog waveform at regular intervals to generate and store in a first random access memory digitally encoded data points representing the waveform magnitude. Only data points minimally different in magnitude from the most recently stored data point are stored. The number of sampling periods between successively stored data points is counted and stored in a second random access memory. Provisions are made for external control over data acquisition cycle start, the number of data points to be stored, sampling frequency, and difference minimum required to initiate storage.

20 Claims, 3 Drawing Figures

WAVEFORM MEMORY CIRCUIT

BACKGROUND OF THE INVENTION

The present invention relates in general to circuits for converting sampled points along an analog waveform to stored digital data points and in particular to such a circuit as will minimize the number of stored sample points required to accurately characterize the analog signal.

In a number of applications, including storage type oscilloscopes, an analog waveform is sampled by an analog-to-digital (A/D) converter at regular intervals and converted to a series of digitally encoded signals representing the magnitude of the sampled analog waveform. The digitally encoded signals are then stored in a digital memory. If the stored points are later applied in proper order to the input of a digital-to-analog (D/A) converter at the original sampling frequency, the D/A converter output will recreate the original waveform.

The accuracy of waveform recreation depends primarily on the sampling frequency. A rapidly varying waveform requires a higher sampling frequency than a slowly varying waveform for similar reproduction accuracy and therefore requires a larger memory for data storage, if all the sampled points are stored. Sampled waveforms sometimes vary in an irregular fashion with one part varying slowly, or not at all, and with another part of the waveform varying rapidly. This is typical of a "burst" type waveform. A sampling rate adjusted for accurate characterization of the rapidly varying portion of the waveform is much higher than necessary for accurate characterization of the slowly or nonvarying portion of the waveform and would produce many more points during the slowly varying portion than needed for accurate waveform reproduction. These additional data points use up memory space.

In the prior art, memory requirements have been reduced by varying the sampling rate, using a faster sampling rate when an analog waveform varies rapidly and a slower sampling rate when the waveform varies slowly. In Japanese Laid Open Pat. No. 17598/83 (filed July 24, 1981 and laid open Feb. 1, 1983), successive sample points are continuously compared. If they differ by more than a set amount, the sampling rate is increased to a higher rate. When the next sample point is stored, a flag is stored with the data to indicate that the sampling period for that data was shorter. Should any successive samples differ by less than the set amount, the sampling rate is reduced to a lower rate. Thus slowly varying portions of an analog waveform are sampled at one rate while more rapidly varying portions of the signal are sampled at a second and higher rate.

For a given level of accuracy, the number of stored sampled points required to characterize an irregularly varying analog waveform is thus reduced over the number required by the traditional, constant sampling rate, approach. However, the amount of memory reduction is limited when only two sampling rates are permissible. Also when the circuit is operating at the lower sampling rate, a higher frequency signal burst could be missed, leading to some inaccuracy.

Therefore, what is needed is a means to minimize the amount of memory required to store an accurate digital representation of a sampled analog waveform.

SUMMARY OF THE INVENTION

According to the present invention, a waveform memory circuit samples an analog waveform at regular periods, converts the sampled points to proportional digital data and stores the digital data points in a first random access memory (RAM). However, not all of the generated sampled data points are stored in memory. Only data points substantially different in magnitude from the most recently stored data point are actually stored. Thus, while the sampling rate remains constant, the proportion of generated sample data actually stored in memory is higher for a rapidly changing analog waveform than for a slowly changing waveform.

Since the time interval between successive stored data points can vary, it is necessary to also determine and store the time interval between successive data points in order to retain enough information to characterize the waveform. Therefore, the present invention counts the number of sampling periods between successively stored data points and stores the counts in a second RAM. The magnitude and period information in the two memories may then be used by external circuits to accurately reconstruct the original waveform.

The circuit comprises a first random access memory for storing sample data, a source of clock pulses for controlling sampling rate, an analog-to-digital converter to sample the analog waveform and produce the digital sample data, and a memory controller. The memory controller compares the current digital sample with the last sample to be stored in the sample memory. If the magnitude of the current sample data differs from that of the last sample data stored by a set minimum, the memory controller generates a "SAVE" pulse causing the sample memory to store the current sample data. The memory controller increments the address of the sample memory each time sample data is stored. Thus, when the waveform changes rapidly, sample points are stored more frequently than when the waveform changes slowly. The frequency of sample point storage is directly proportional to the rate of change of the analog waveform.

The present invention further comprises a counter for counting the number of sample periods between successively stored sample points and a second RAM for storing the number of periods so counted. Each time the memory controller issues a SAVE pulse, the period memory stores the current count from the period counter at an address controlled by the memory controller. The SAVE pulse also resets the period counter. Additionally, the counter will signal the memory controller to issue a SAVE pulse if the number of periods counted reaches a set amount. This prevents a count from exceeding the word length capacity of the period memory in the case of a very slowly changing analog signal.

The present invention also comprises a master controller to permit external control over data acquisition cycle start and the number of data points stored following a trigger pulse. The acquisition cycle begins when the master controller receives an initiating signal from external circuits. Upon receipt, the master controller transmits a signal to the memory controller causing it to generate the first SAVE pulse and enabling it to begin issuing subsequent SAVE pulses. The master controller then counts SAVE pulses issued by the memory controller. When the number of SAVE pulses reaches a first limit, the master controller suspends the pulse count until reception of a trigger pulse from external circuits. The first limit is determined by data received from external circuits. On receipt of a trigger pulse, the master controller resumes the SAVE pulse count up to a second limit corresponding to the maximum size of the sample and period memories. The master controller then disenables the memory controller and issues a signal to external circuits to signify completion of a data acquisition cycle.

Finally, in the preferred embodiment, the clock output is prescaled by an externally controllable frequency divider circuit to permit an adjustable sampling rate.

It is therefore an object of the present invention to provide a new and improved waveform memory circuit to convert an analog signal into digital data and to store a portion of that data in random access memory.

It is another object of the present invention to provide such new and improved waveform memory circuit wherein the sampling rate is held at a constant frequency while the proportion of sample data stored increases or decreases in proportion to the rate of change of the analog signal.

Still further objects of the present invention are to provide such new and improved waveform memory circuit wherein data acquisition cycle start, the number of data points stored following a trigger pulse, the sampling frequency, and the difference minimum required to initiate storage may all be adjusted by externally controlled signals.

The invention resides in the combination, construction, arrangement and disposition of the various component parts and elements incorporated in a waveform memory circuit constructed in accordance with the principles of this invention. The present invention will be better understood and objects and important features other than those specifically enumerated above will become apparent when consideration is given to the following details and description, which when taken in conjunction with the annexed drawing describe, disclose, illustrate, and show a preferred embodiment or modification of the present invention and what is presently considered and believed to be the best mode of practicing the principles thereof.

DETAILED DESCRIPTION OF THE PREFERRED EMBODIMENT

Figure 1:
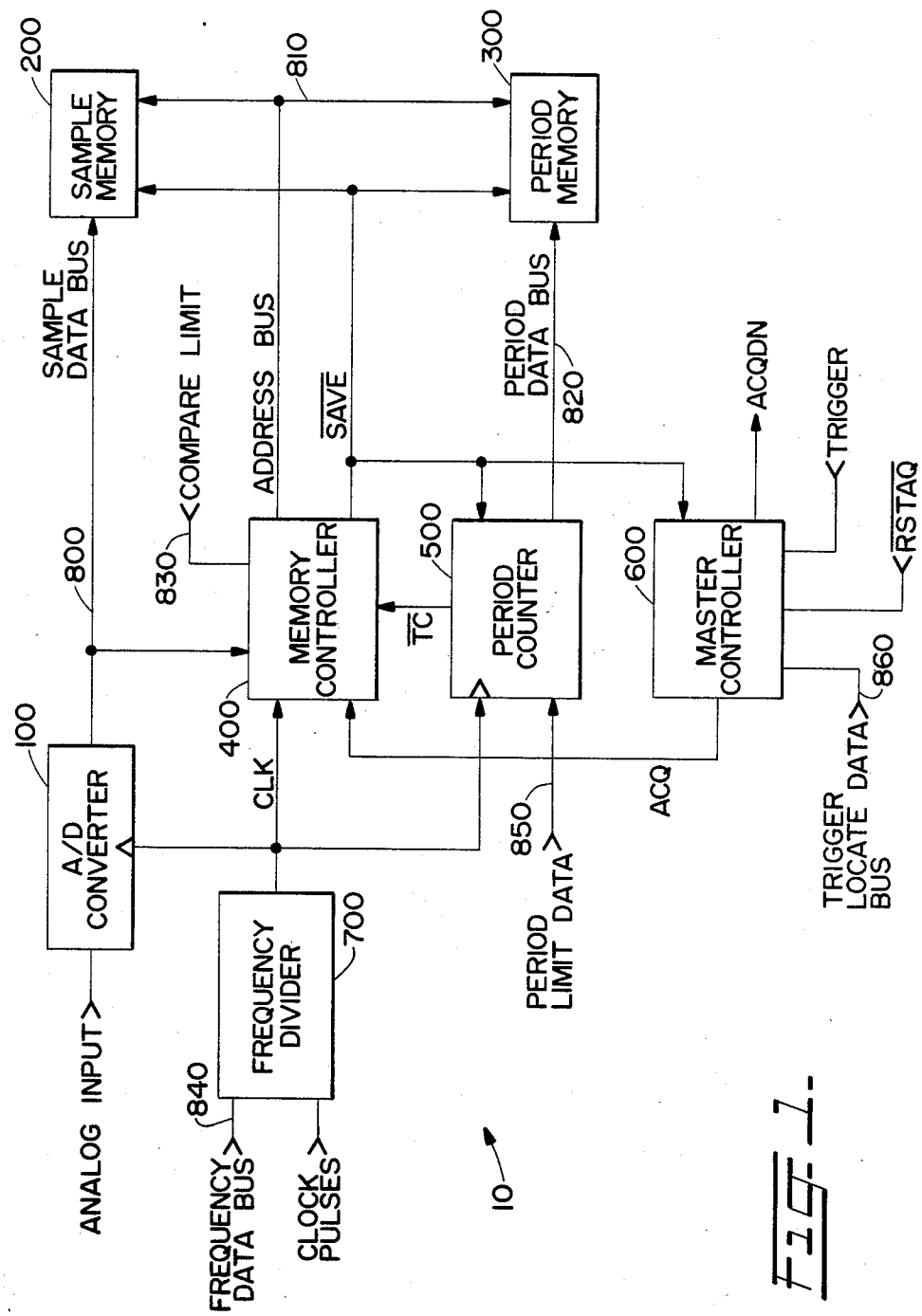
FIG. 1 is a block diagram of the preferred embodiment of the present invention.

FIG. 1 is a block diagram of the present invention, a waveform memory circuit, generally noted by reference character 10. System 10 comprises analog-to-digital converter 100, sample memory 200, period memory 300, memory controller 400, period counter 500, master controller 600 and frequency divider 700. Frequency divider circuit 700 receives a stream of regular clock pulses of frequency F, and generates a pulsed output, labeled "CLK", of frequency F/N. N is an integer determined by data on frequency data bus 840. The CLK signal is applied to converter 100, memory controller 400 and period counter 500.

An analog input waveform to be sampled and stored is applied to converter 100. Each time frequency divider 700 transmits a CLK pulse, converter 100 outputs a digital signal on sample data bus 800 coded to represent the magnitude of the analog input. Data bus 800 supplies a sample to memory 200 and memory controller 400. Sample memory 200 stores the data on data bus 800 whenever it receives a "SAVE" command from memory controller 400 and at the same time memory controller 400 stores the same data in an internal register. If the current sample data on bus 800 from converter 100 differs by a minimum difference amount from the last sample data stored in its internal register, memory controller 400 issues a SAVE output pulse causing sample memory 200 to store the data currently on data bus 800, while also storing the same data in the said register. The amount by which the old and new sample data must differ before memory controller 400 issues a SAVE pulse is controlled by digitally encoded data on compare limit data bus 830.

Sample data is stored at a memory address controlled by memory controller 400 through address bus 810. Each time memory controller 400 issues a SAVE pulse, it increments the address on address bus 810 so the sample data is stored sequentially in sample memory 200. Period counter 500 counts CLK pulses and outputs the current count on period data bus 820 applied to period memory 300. Each time memory controller 400 issues a SAVE pulse, period memory 300 stores the current count at the address indicated on bus 810. Following a SAVE pulse, period counter 500 resets the current period count to zero. Thus, upon each SAVE pulse, period memory 300 stores the number of CLK pulses occurring since the last SAVE pulse.

To prevent a period count from exceeding the word length capacity of period memory 300, and to otherwise limit the number of periods between successively stored data points, counter 500 outputs a negative-going TC pulse to memory controller 400 upon reaching an adjustable limit. The limit is set by externally applied data on period limit data bus 850. Upon receipt of a TC pulse, memory controller 400 outputs a SAVE pulse to initiate data storage and reset counter 500.

Thus, while converter 100 samples the analog signal and outputs digital data on bus 800 at a constant rate determined by the CLK signal, not all such data is stored in sample memory 200. To be stored in sample memory 200, the current data must differ from the last stored data point by the amount set on bus 830. A more rapidly changing analog signal will result in more frequently stored data points than a less rapidly changing analog signal. Each time sample magnitude data is stored in sample memory 200, sample timing data is stored in period memory 300 at a corresponding memory address whereby the magnitude and timing data comprise an adjustably accurate characterization of the analog waveform. Accuracy may be externally controlled by modification of sampling rate through bus 840 or by modification of the difference limit through bus 830.

Master controller 600 facilitates additional external control of the data acquisition cycle. The data acquisition cycle is started by a negative-going RSTAQ pulse from external circuits. On receipt of a RSTAQ pulse, master controller 600 outputs an ACQ signal to memory controller 400 forcing it to output an initial SAVE signal and enabling it to generate subsequent SAVE pulses as described above. Master controller 600 also allows external control over the number of data points stored following receipt of an externally generated trigger (TRIG) pulse. The number of SAVE pulses following receipt of a TRIG pulse is limited by externally applied data on trigger locate bus 860. When the SAVE count reaches the set limit, master controller 600 turns off the ACQ signal to prevent memory controller 400 from issuing any more SAVE pulses. At the same time, master controller 600 generates an ACQDN pulse to external circuits to indicate completion of a data acquisition cycle.

A/D converter 100, sample memory 200, period memory 300, period counter 500 and frequency divider 700, shown as blocks in FIG. 1, may be constructed in a variety of ways well known in the art and need not be discussed in detail herein. Preferred embodiments of memory controller 400 and master controller 600 are depicted in more detail in FIGS. 2 and 3 for illustrative purposes. It is understood that memory controller 400 and master controller 600 may be implemented in a variety of ways other than as shown in FIGS. 2 and 3.

Figure 2:
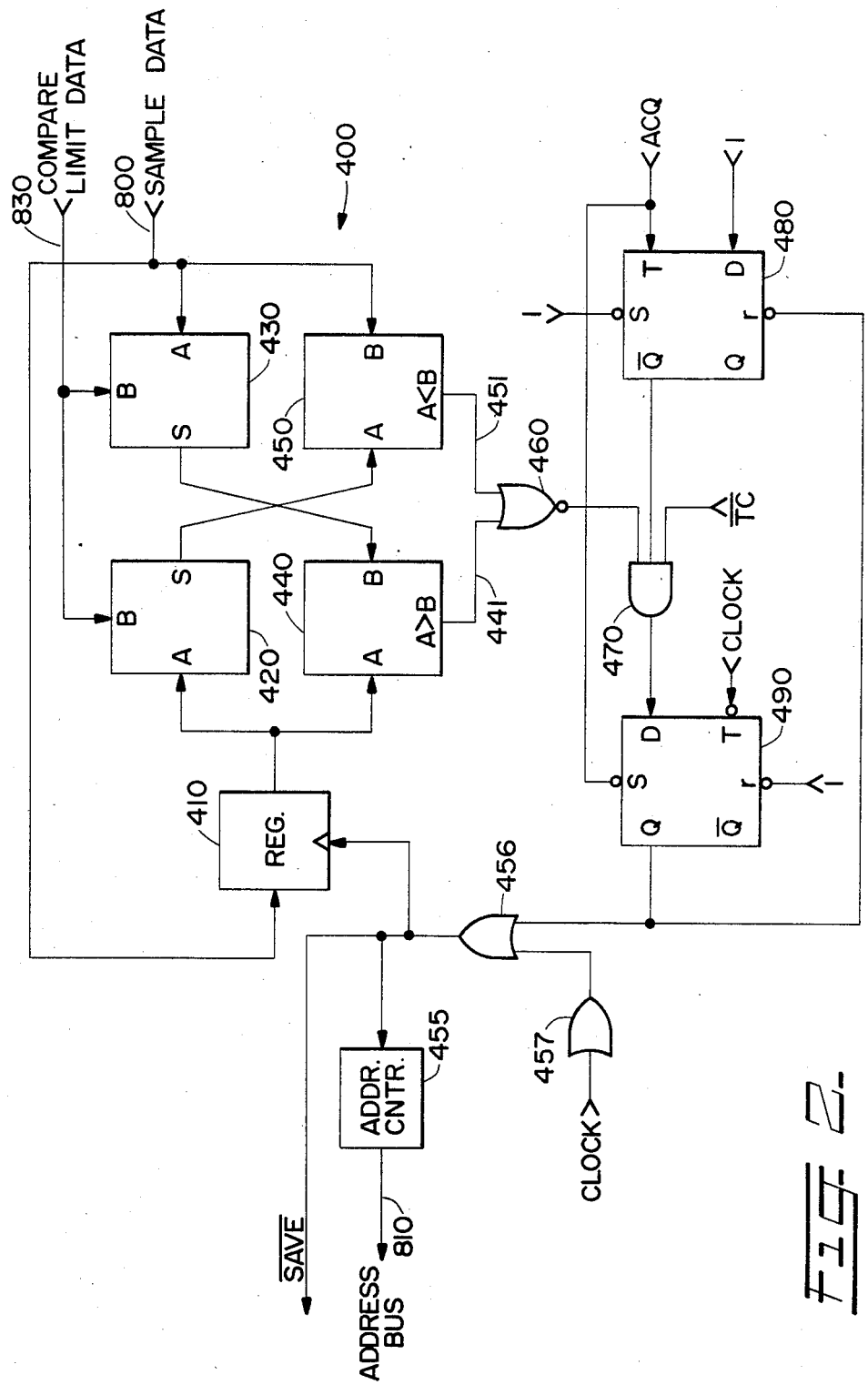
FIG. 2 is a block diagram depicting a more detailed implementation of the memory controller of FIG. 1.
Figure 3:
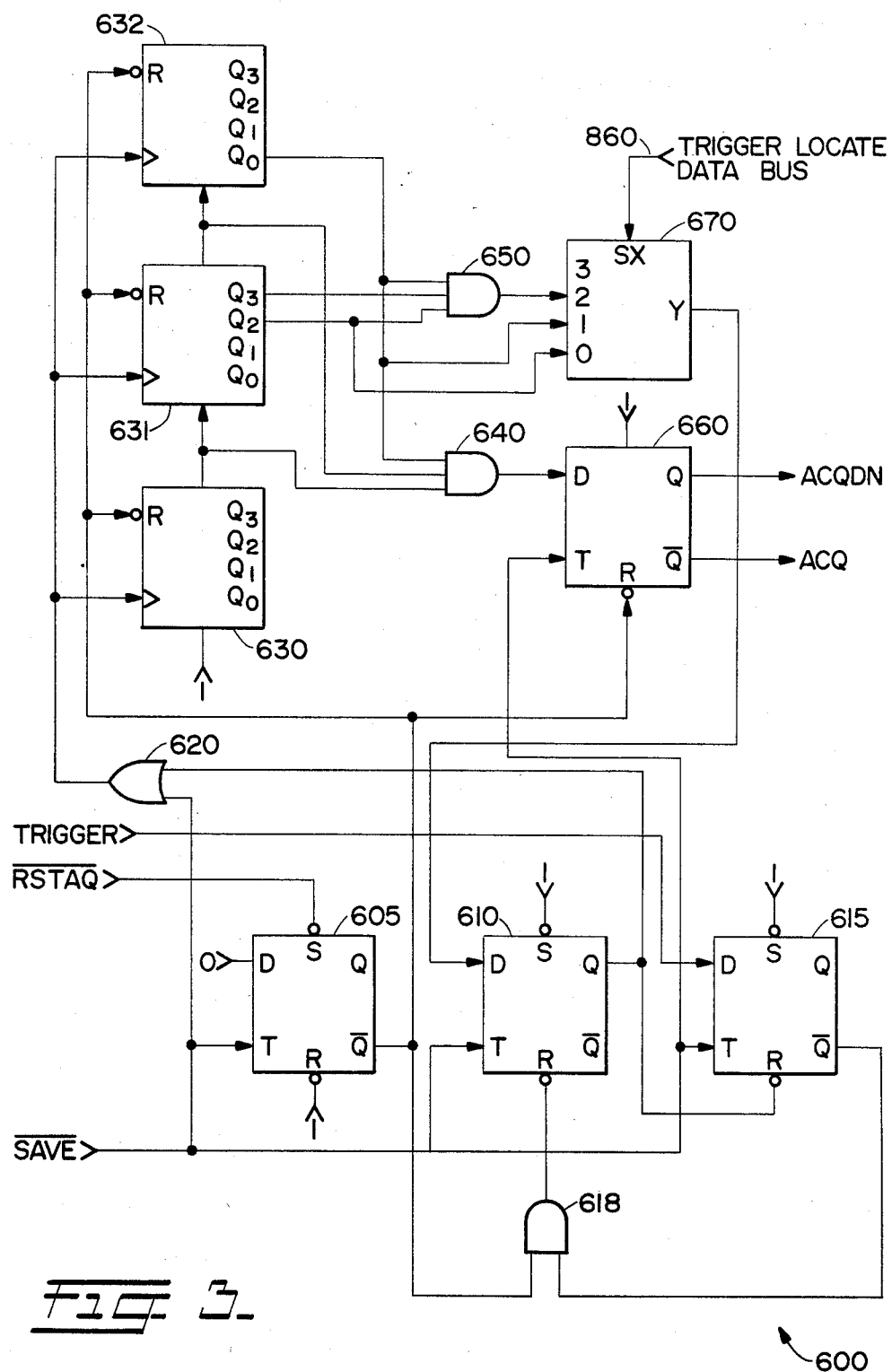
FIG. 3 is a block diagram depicting a more detailed implementation of the master controller of FIG. 1.

Referring to FIG. 2, memory controller 400 comprises register 410, adders 420 and 430, comparators 440 and 450, address counter 455, OR gates 456 and 457, NOR gate 460, AND gate 470 and type D flip-flops 480 and 490. The negative-going SAVE pulse generated by memory controller 400 occurs at the output of OR gate 456. This output is normally high between data acquisition cycles because the input to gate 456 from the Q output of flip-flop 490 is normally high. Prior to the receipt of a high ACQ signal from master controller 600 to initiate a data acquisition cycle, flip-flop 490 remains set with the Q output high. During a data acquisition cycle, the ACQ signal from master controller 600 is held high enabling the D and T inputs to flip-flop 490 to control setting and resetting. The Q output of flip-flop 490 can then be driven low on the trailing edge of a CLK pulse if the D input to the flip-flop is low and the D input to flip-flop 490 will be low when any one of the three inputs to AND gate 470 goes low. One such input to gate 470 is controlled by the ACQ signal from master controller 600 through flip-flop 480. With the D input of flip-flop 480 held high, the −Q output of flip-flop 480 goes low when the ACQ signal goes high. The output of gate 470, the Q output of flip-flop 490, and the output of OR gate 456 all go low. On receipt of the negative-going SAVE pulse output of OR gate 456, sample memory 200 stores the data currently on sample data bus 800 at the address currently on address bus 810 and register 410 saves the data currently on sample data bus 800.

The Q output of flip-flop 490 is applied to the inverted reset input of flip-flop 480. Register 480 resets, causing the D input to flip-flop 490 to go high again, terminating the SAVE pulse. Address counter 455 increments the address on address bus 810 on the trailing (rising) edge of the negative-going SAVE pulse. Memory controller 400 thus generates an initial SAVE pulse causing an initial data storage whenever it receives an ACQ signal from master controller 600.

Another input to AND gate 470 is controlled by the TC output of period counter 500, allowing the counter to force a SAVE pulse whenever it reaches a set limit. A negative-going TC pulse input to AND gate 470 from period counter 500 initiates a SAVE pulse output on flip-flop 490. The SAVE pulse resets period counter 500, terminating the TC pulse, and flip-flop 490 then resets to terminate the SAVE pulse. Thus memory controller 400 also issues a SAVE pulse upon receipt of a TC pulse from period counter 500.

The third input to AND gate 470 is high or low depending on the magnitude difference between current A/D converter output and the last converter output stored in register 410. Like sample memory 200, register 410 stores the data on bus 800 on the leading (negative-going) edge of a SAVE pulse and, accordingly, register 410 retains the last data stored by sample memory 200. Adder 420 adds the data stored by register 410 to the comparison limit data on bus 830 and outputs the result at the S terminal. Adder 430 adds the current sample data on bus 800 to the comparison limit data on bus 830 and provides the result on its S terminal. Comparator 440 compares the data contained in register 410 with the output of adder 430 and if the magnitude of the last data stored exceeds the magnitude of the current sample data on bus 800 by more than the limit on bus 830, comparator 440 output 441 goes high. Comparator 450 compares the contents of sample data bus 800 with the output of adder 420. If the magnitude of the new data exceeds the magnitude of the last data stored by more than the amount of the comparison limit data on bus 830, comparator 450 drives output 451 high.

Outputs 441 and 451 are coupled to the inputs of NOR gate 460 the output of which, as applied to AND gate 470, goes low if either input goes high. With the D input low, flip-flop 490 resets on the trailing edge of the next clock pulse, driving the Q output to initiate a SAVE pulse via OR gate 456. The leading edge of the SAVE pulse of memory controller 400 causes register 410 and sample memory 200 to store the current data on sample data bus 800. Since the data stored in register 410 and the current data on sample data bus 800 are now identical, comparator outputs 441 and 451 go low, driving the D input of flip-flop 490 back high. The SAVE pulse is terminated a short time after the leading edge of the next CLK pulse when the output of OR gate 457 goes high with OR gate 457 being provided to delay the CLK pulse input to OR gate 456. Using the delayed clock pulse to turn off the SAVE pulse rather than allowing the reset of flip-flop 490 to terminate a SAVE pulse prevents overlap of consecutive SAVE pulses.

Memories 200 and 300 store data sequentially at addresses determined by address counter 455. Address counter 455 increments the address on bus 810 on the trailing (rising) edge of the SAVE pulses and outputs a digital signal representing the current count on address bus 810. Counter 455 resets automatically to the number of the lowest memory address location upon reaching the highest address location of the sample and period memories.

Thus whenever the new sample data point differs from the last stored point by more than the limit set on bus 830, memory controller 400 stores the current data in register 410 for comparison to subsequent sample data, generates a negative-going SAVE pulse to initiate data storage, and increments the memory address for the next data to be saved.

FIG. 3 is a block diagram depicting a more detailed implementation of master controller 600 of FIG. 1 comprising type D flip-flops 605, 610, 615 and 660, four bit counters 630, 631 and 632, multiplexer 670, AND gates 618, 640 and 650, and OR gate 620. To restart a data acquisition cycle, a RSTAQ pulse from external circuits sets flip-flop 605. The −Q output of flip-flop 605 goes low resetting counters 630, 631 and 632, and flip-flop 660, while flip-flop 610 is also reset through gate 618.

The −Q output of flip-flop 660 goes high initiating an ACQ signal to enable memory controller 400 and to force an initial SAVE pulse. The initial negative-going SAVE pulse resets flip-flop 605 permitting 4-bit counters 630, 631 and 632 to begin counting SAVE pulses. The counters are interconnected such that the Q0 output of counter 630 is the least significant bit and the Q3 output of counter 632 is the most significant bit of a count. Counter outputs are applied to multiplexer 670 and gate 650 with the output of gate 650 also being applied to one input of the multiplexer. Output Y of multiplexer 670 goes high whenever a selected input (labeled 0 to 3) to the multiplexer goes high, wherein the selected input is determined by the data on trigger locate data bus 860 generated by external circuits. In the present arrangement, multiplexer input 0 goes high after the counters count 64 SAVE pulses, input 1 goes high after 256 SAVE pulses, and input 2 goes high after 448 SAVE pulses. Input 3 is not used in the present embodiment.

When output Y of multiplexer 670 goes high, flip-flop 610 is set, driving one input to gate 620 high and preventing SAVE pulses from reaching the counters. However, when a TRIG pulse is subsequently received from external circuits, flip-flop 615 is set, driving its −Q output low, and resetting flip-flop 610 through gate 618, permitting the counters to resume the SAVE pulse count. Counter outputs are further applied to gate 640 such that the gate turns on when the number of SAVE pulses counted plus the initial SAVE pulse equals the number of storage locations (in this case 512) in memories 200 and 300 of FIG. 1. When the counters reach the limit determined by gate 640, flip-flop 660 is set, initiating an ACQDN signal to external circuits and turning off the ACQ signal to memory controller 400 to prevent further SAVE pulses. The acquisition cycle is then complete.

Thus while the waveform memory circuit of the present invention samples and encodes an analog waveform at constant intervals, data is stored only when the magnitude of the waveform has changed by a minimal amount thereby greatly reducing the amount of memory required to accurately characterize a waveform.

While a preferred embodiment of the present invention has been described, it will be apparent to those skilled in the art that many changes and modifications may be made without departing from the invention in its broader aspects. The appended claims are therefore intended to cover all such changes and modifications as fall within the true spirit and scope of the present invention.

I claim:

1. An apparatus for converting an analog waveform to stored digital data representative of said signal comprising:
    a converter to sample the waveform and output digitally encoded data representing successive samples of the waveform,
    a memory for storing digitally encoded samples of the waveform, and
    means for detecting change in the digitally encoded output by a predetermined amount for thereupon initiating storage of digitally encoded data in said memory representative of a given sample.

2. An apparatus as in claim 1 further including means for storing the intervals between storage of digital data in said memory.

3. An apparatus for converting an analog waveform to representative stored digital data comprising:
    a converter to sample the waveform and output digitally encoded data representing the current magnitude of the waveform,
    an addressable memory for storing the converter output at a current address, and
    a memory controller to generate SAVE pulses, each SAVE pulse being applied to the memory to initiate storage of the converter output, a SAVE pulse being generated when the current converter output has changed by a minimum amount since the last occurrence of a SAVE pulse.

4. An apparatus as in claim 3 wherein the minimum difference amount is determined by an externally generated, digitally encoded signal applied to the memory controller.

5. An apparatus as in claim 3 wherein the memory controller comprises:
    a register for storing the converter output on each occurrence of a SAVE pulse,
    means to generate a SAVE pulse when the difference between the register contents and the current converter output exceeds the minimum difference amount, and
    means to generate a digitally encoded SAVE pulse count.

6. An apparatus as in claim 5 wherein the SAVE pulse generating means comprises:
    a first adder coupled to output a signal representing the sum of the contents of the register and the minimum difference amount,
    a second adder coupled to output a signal representing the sum of the current converter output and the minimum difference amount,
    a first comparator coupled to output a signal when the contents of the register exceeds the output of the second adder,
    a second comparator coupled to generate an output signal when the current converter output exceeds the output of the first adder, and
    means coupled to generate a SAVE pulse whenever the first or the second comparator generates an output.

7. An apparatus as in claim 6 wherein the minimum difference amount is determined by an externally generated, digitally encoded signal applied to the first and second adders.

8. An apparatus for converting an analog waveform to representative stored digital data comprising:
    a source of constant frequency pulses,
    a frequency divider circuit, coupled to the pulse source, to generate clock pulses having a frequency which is an adjustable fraction of the frequency of the pulse source,
    a converter to sample the waveform and output digitally encoded data representing the current magnitude of the waveform on each occurrence of a clock pulse,
    an addressable memory for storing the converter output at a current address, and
    a memory controller to generate SAVE pulses, each SAVE pulse being applied to the memory to initiate storage of the converter output, a SAVE pulse being generated when the current converter output has changed by a minimum amount since the last occurrence of a SAVE pulse, the memory controller changing the current address on each occurrence of a SAVE pulse.

9. An apparatus as in claim 8 wherein the clock pulse frequency is controlled by an externally generated signal applied to the frequency divider.

10. An apparatus for converting an analog waveform to representative stored digital data comprising:
   a source of clock pulses,
   a converter to sample the waveform and output digitally encoded data representing the current magnitude of the waveform on each occurrence of a clock pulse,
   a first addressable memory for storing the converter output at a current address,
   a counter coupled to count clock pulses and output digital data representing the current clock pulse count,
   a second addressable memory for storing the current clock pulse count at a current address, and
   a memory controller to generate SAVE pulses, each SAVE pulse being applied to the first memory to initiate storage of the converter output, and to the second memory to initiate storage of the counter output, a SAVE pulse being generated when the current converter output has changed by a minimum amount since the last occurrence of a SAVE pulse, the memory controller changing the current address on each occurrence of a SAVE pulse.

11. An apparatus as in claim 10 wherein the minimum difference amount is determined by an externally generated, digitally encoded signal applied to the memory controller.

12. An apparatus as in claim 10 wherein each storage address of the first memory has a corresponding storage address in the second memory.

13. An apparatus as in claim 10 wherein the memory controller comprises:
   a register for storing the converter output on each occurrence of a SAVE pulse,
   means to generate a SAVE pulse when the difference between the register contents and the current converter output exceeds the minimum difference amount, and
   means to generate a digitally encoded SAVE pulse count.

14. An apparatus as in claim 13 wherein the SAVE pulse generating means comprises:
   a first adder coupled to output a signal representing the sum of the contents of the register and the minimum difference amount,
   a second adder coupled to output a signal representing the sum of the current converter output and the minimum difference amount,
   a first comparator coupled to generate an output signal when the contents of the register exceeds the output of the second adder,
   a second comparator coupled to generate an output signal when the current converter output exceeds the output of the first adder, and
   means coupled to generate a SAVE pulse whenever the first or the second comparator generates an output.

15. An apparatus as in claim 14 wherein the minimum difference amount is determined by an externally generated, digitally encoded signal applied to the first and second adders.

16. An apparatus for converting an analog waveform to representative stored digital data comprising:
   a source of clock pulses,
   a converter to sample the waveform and output digitally encoded data representing the current magnitude of the waveform on each occurrence of a clock pulse,
   a first addressable memory for storing the converter output at a current address,
   a counter coupled to count clock pulses and output digital data representing the current clock pulse count,
   a second addressable memory for storing the current clock pulse count at a current address,
   a memory controller to generate SAVE pulses, each SAVE pulse being applied to the first memory to initiate storage of the converter output, and to the second memory to initiate storage of the counter output, a SAVE pulse being generated when the current converter output has changed by a minimum amount since the last occurrence of a SAVE pulse, the memory controller changing the current address on each occurrence of a SAVE pulse, and
   a master controller coupled to count SAVE pulses, to receive an externally generated restart signal, and to inhibit the memory controller from issuing SAVE pulses prior to occurrence of a restart signal or after the SAVE pulse count reaches a set upper limit, the SAVE pulse count being reset on each occurrence of a restart signal.

17. An apparatus as in claim 16 wherein the master controller transmits a signal to external circuits to signify completion of a data acquisition cycle when the SAVE pulse count reaches the set upper limit.

18. An apparatus as in claim 16 wherein the master controller is also coupled to receive externally generated trigger and lower limit signals, the SAVE pulse count being suspended upon reaching a lower limit and being resumed upon occurrence of a trigger signal, the lower limit being controlled by the lower limit signal.

19. An apparatus as in claim 18 wherein the master controller comprises:
   a counter for counting SAVE pulses,
   means coupled to inhibit the memory controller from issuing SAVE pulses prior to occurrence of a restart signal,
   logic means for generating output signals when the SAVE pulse count reaches any one of a plurality of predetermined levels, a different logic means output signal being generated upon reaching each predetermined level,
   multiplexing means for generating an output signal upon receipt of a selected logic means output signal, the selection being controlled by the externally generated lower limit signal,
   means to suspend the SAVE pulse count on occurrence of a multiplexing means output signal,
   means to resume the SAVE pulse count on receipt of an externally generated trigger signal, and
   means coupled to inhibit the memory controller from issuing SAVE pulses after the SAVE pulse count reaches a set upper limit, the SAVE pulse count being reset on each occurrence of a restart signal.

20. An apparatus as in claim 16 wherein the minimum difference amount is determined by an externally generated, digitally encoded signal applied to the memory controller.

* * * * *